US008835195B2

(12) United States Patent
Xie et al.

(10) Patent No.: US 8,835,195 B2
(45) Date of Patent: Sep. 16, 2014

(54) CORRUGATED MEMBRANE MEMS ACTUATOR FABRICATION METHOD

(75) Inventors: Yonglin Xie, Pittsford, NY (US); Weibin Zhang, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 218 days.

(21) Appl. No.: 13/552,721

(22) Filed: Jul. 19, 2012

(65) Prior Publication Data

US 2014/0024147 A1   Jan. 23, 2014

(51) Int. Cl.
*H01L 21/00* (2006.01)
(52) U.S. Cl.
USPC .................. 438/21; 257/415; 347/65
(58) Field of Classification Search
USPC .................. 438/21; 257/415; 347/65
See application file for complete search history.

(56) References Cited

U.S. PATENT DOCUMENTS

| | | | |
|---|---|---|---|
| 3,614,677 A | 10/1971 | Wilfinger | |
| 4,480,259 A | 10/1984 | Kruger et al. | |
| 6,130,690 A | 10/2000 | Ahn | |
| 6,217,157 B1 | 4/2001 | Yoshihira et al. | |
| 6,312,109 B1 | 11/2001 | Chen | |
| 6,334,670 B1 | 1/2002 | Yoshihira et al. | |
| 6,336,711 B1 | 1/2002 | Ahn | |
| 6,345,883 B1 | 2/2002 | Shin et al. | |
| 6,378,991 B1 | 4/2002 | Lim et al. | |
| 6,431,688 B1 | 8/2002 | Shin et al. | |
| 6,705,716 B2 | 3/2004 | Mott | |
| 7,331,651 B2 * | 2/2008 | Silverbrook et al. | ........... 347/44 |

FOREIGN PATENT DOCUMENTS

| | | |
|---|---|---|
| EP | 0 845 358 | 6/1998 |
| EP | 0 882 592 | 9/2005 |
| JP | 2007112099 | 5/2007 |

OTHER PUBLICATIONS

Scheeper et al., "The Design, Fabrication, and Testing of Corrugated Silicon Nitride Diaphragms", *Journal of Microelectromechanical Systems*, vol. 3, No. 1, Mar. 1994, pp. 36-42.

* cited by examiner

*Primary Examiner* — David Vu
(74) *Attorney, Agent, or Firm* — William R. Zimmerli (57) ABSTRACT

A MEMS device fabrication method includes providing a substrate and a chamber wall material layer on a first surface of the substrate, the chamber wall material layer including a chamber cavity having a sacrificial material located therein. A mask material is deposited on the chamber wall material layer and the sacrificial material and patterned to form a mask pattern including a plurality of discrete portions. The mask material and some of the sacrificial material are removed to transfer the mask pattern including the plurality of discrete portions to the sacrificial material. A membrane material layer is deposited on the chamber wall material layer and the sacrificial material that includes the transferred mask pattern including the plurality of discrete portions. Some of the substrate and the sacrificial material are removed to release the membrane material layer using at least one process initiated from a second surface of the substrate.

8 Claims, 6 Drawing Sheets

CORRUGATED MEMBRANE MEMS ACTUATOR FABRICATION METHOD

CROSS REFERENCE TO RELATED APPLICATIONS

Reference is made to commonly-assigned, U.S. patent application Ser. No. 13/552,728 (now U.S. Pat. No. 8,757, 780), entitled "CORRUGATED MEMBRANE MEMS ACTUATOR" and Ser. No. 13/552,735 (now U.S. Pat. No. 8,727,501), entitled "MEMBRANE MEMS ACTUATOR INCLUDING MOVING WORKING FLUID", all filed concurrently herewith.

FIELD OF THE INVENTION

This invention relates to a micro-electromechanical systems, and more particularly to the manufacture of these devices.

BACKGROUND OF THE INVENTION

Micro-electromechanical systems (MEMS) are very small devices manufactured using a variety of lithography based process for controlling the deposition and removal of material layers on a substrate. One early example of a MEMS device, described in U.S. Pat. No. 3,614,677, is the resonistor—an electromechanical monolithic resonator. There are many applications of MEMS, broadly categorized as sensors, actuators and structures. One type of actuator includes ink jet actuators.

A useful structure in some MEMS devices is a diaphragm. For example, in a microphone or acoustic sensor, a diaphragm can be made that will resonate and couple its energy well to the acoustic field in the environment. A simple process for making a diaphragm involves depositing a layer of the diaphragm material onto a silicon substrate and then removing a portion of the substrate through an etching process, leaving the diaphragm material suspended over the resulting cavity. Typically, such diaphragm material has a high tensile strength, so it is not very flexible or stretchy. An enhancement in performance and flexibility of the diaphragm can be achieved by providing the diaphragm with a corrugated shape. Scheeper et al. describe one way to produce a corrugated microphone diaphragm (Journal of Micro-electromechanical Systems Vol. 3, No. 1, March 994, pages 36-42).

Fluidic MEMS devices, such as an ink jet print head, often feature fluid filled chambers that are in fluidic communication to allow a fluid to move through the device. It is well understood in the art that such chambers can be made by using a mask material layer, typically a photoresist layer, that can then be selectively exposed using an optical mask with a pattern of transparent and opaque regions that will then allow an actinic light to selectively expose only certain regions of the mask layer. This causes a reaction that will either harden the exposed region (in the case of a positive photoresist) or the unexposed region (with a negative photoresist). Subsequent etching will then remove the mask layer in select regions thereby forming the chambers. The chambers are finished by filling with a sacrificial material and then depositing a roof layer followed by removal of the sacrificial material.

One type of ink jet print head is based on the thermal ink jet (TIJ) or bubble jet technology. Typical thermal ink jet inks are aqueous based fluids. A resistive heater embedded in the wall of a fluid chamber is energized to boil the ink in the fluid chamber. A vapor bubble forms over the heater to force fluid out a nozzle and eject a drop. Thermal ink jet technology is typically used in home/office printers due to its low cost and high resolution although it has been used in some industrial and commercial printing applications. However, its use in these types of applications is considered to be limited due to narrow ink latitude (need to boil ink to form bubbles) and short print head life (corrosive ink attack hot heaters). The print speed of existing thermal ink jet technology is also often too slow due to low drop generation frequency.

Another type of ink jet print head is based on piezoelectric ink jet (PIJ) technology. A piezoelectric actuator forms part of the wall of a fluid chamber. When the piezoelectric actuator is energized, the deformation or displacement of the actuator causes the pressure in the fluid chamber to rise to force fluid out a nozzle and eject a drop. Piezoelectric ink jet technology is widely used in industrial printing due to its wide ink latitude and long print head life. However, the piezoelectric ink jet print head has low nozzle density and high manufacturing cost comparing to thermal ink jet print head due to small actuator displacement. As a result, the piezoelectric print heads are usually large in size and expensive to make. The print speed of existing piezoelectric ink jet technology is also often too slow due to low drop generation frequency.

Therefore, there is an ongoing need for an ink jet print head that is low cost and has high resolution, wide ink latitude, and long print head life.

SUMMARY OF THE INVENTION

According to one aspect of the present invention, a method of fabricating a MEMS device with a membrane material layer that is suspended at the edges but free to move in the center region is provided. The ability of the membrane to move is further enhanced by producing a membrane with a corrugated shape. The corrugated membrane formed using the present invention can be manufactured in a spatial relationship with a MEMS actuator including, for example, a heater, a piezoelectric actuator, or a thermal bi-morph actuator. The fabricating method of the present invention also contemplates adjusting the characteristics of a sacrificial layer upon which the corrugated diaphragm is made, thus allowing for a fine tuned corrugation shape to optimize the performance and durability of the diaphragm layer.

According to another aspect of the present invention, a method of fabricating a MEMS device includes providing a substrate including a first surface and a second surface and providing a chamber wall material layer on the first surface of the substrate, the chamber wall material layer including a chamber cavity, the chamber cavity having a sacrificial material located therein. A mask material is deposited on the chamber wall material layer and the sacrificial material. The mask material is patterned to form a mask pattern including a plurality of discrete portions. The mask material and some of the sacrificial material is removed using an etching process to transfer the mask pattern including the plurality of discrete portions to the sacrificial material. A membrane material layer is deposited on the chamber wall material layer and the sacrificial material that includes the transferred mask pattern including the plurality of discrete portions. Some of the substrate is removed using a material removal process initiated from the second surface of the substrate to expose the sacrificial material from the second surface of the substrate. The sacrificial material is removed using an etching process initiated from the second surface of the substrate to release the membrane material layer.

BRIEF DESCRIPTION OF THE DRAWINGS

In the detailed description of the example embodiments of the invention presented below, reference is made to the accompanying drawings, in which.

DETAILED DESCRIPTION OF THE INVENTION

The present description will be directed in particular to elements forming part of, or cooperating more directly with, apparatus in accordance with the present invention. It is to be understood that elements not specifically shown or described may take various forms well known to those skilled in the art. In the following description and drawings, identical reference numerals have been used, where possible, to designate identical elements.

The example embodiments of the present invention are illustrated schematically and not to scale for the sake of clarity. One of the ordinary skills in the art will be able to readily determine the specific size and interconnections of the elements of the example embodiments of the present invention.

As described herein, the example embodiments of the present invention provide liquid ejection components typically used in inkjet printing systems. However, many other applications are emerging which use inkjet print heads to emit liquids (other than inks) that need to be finely metered and deposited with high spatial precision. As such, as described herein, the terms "liquid" and "ink" refer to any material that can be ejected by a liquid ejection system or liquid ejection system components incorporating the invention described below.

One class of MEMS devices includes micro-fluidics devices, in particular ink jet print heads. Although there are several categories or types of ink jet print heads, one significant category includes drop-on-demand print heads. Drop-on-demand print heads typically feature a MEMS actuator, for example, a thermal, piezoelectric, or thermal bi-morph actuator. In one conventional configuration for thermal actuators, commonly referred to as a roof-shooter, there is a chamber that has a nozzle opening on one face and a thermal actuator on the opposite face. The chamber is filled with an aqueous fluidic ink. When the actuator is fired, a rapid heat rise causes a portion of the ink to boil. The resultant bubble displaces the ink in the chamber forcing a droplet to be ejected from the nozzle. One limitation on such a design is the requirement that the ink form a bubble when heat is applied to it.

Another design for an inkjet print head uses a diaphragm membrane that can separate a working fluid from an ink and allows mechanical energy from the working fluid chamber to be coupled to the ink fluid chamber in order to eject ink drops after activating an actuator in the working fluid chamber. For example, in a bubble jet print head, a working fluid, which is optimized to form a bubble, is separated from the ink fluid which is ejected from the nozzle by a flexible membrane that is optimized to transmit the change in volume of the ink containing portion of the reservoir due to the bubble formed in the working fluid. The working fluid can be a low boiling point fluid such as alcohol so that the actuator will be more efficient because less energy is required to produce the vapor bubble and to displace the same amount of volume. The working fluid can be a non-corrosive fluid to achieve long life of the print head.

It is desirable to make the flexible membrane out of high modulus materials such as alloys, metals, or dielectric materials to meet the requirements of mechanic strength, durability, and thinness of the membrane. Also, high degree of flexibility in the membrane is required to effectively transmit the pressure generated by the vapor bubble in the working fluid to the ink fluid. This can be achieved by incorporating a corrugated shape in the high modulus material membrane.

In one application of a fluid ejector including the corrugated membrane MEMS actuator of the present invention, a working fluid, which is optimized to form a bubble, is separated from the ink fluid which is ejected from the nozzle by a flexible membrane that is optimized to transmit the pressure produced by to the bubble formed in the working fluid to the ink containing portion of the reservoir. The corrugated membrane made by the present invention divides a chamber to form two fluidic reservoirs that are in mechanical contact through the membrane and in fluidic contact to ink and working fluid reservoirs.

Figure 1:
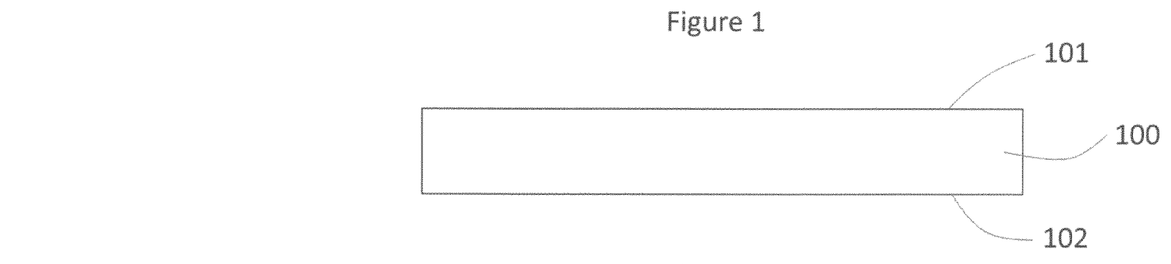
FIG. 1 is a schematic cross sectional view showing a substrate including a first surface and a second surface.

FIG. 1 shows a silicon wafer 100 in cross section that forms part of a corrugated membrane MEMS actuator made according to the present invention. The corrugated membrane MEMS actuator has many applications including, for example, a fluidic or liquid dispenser device. The silicon wafer includes a first surface 101 and a second surface 102. Following common practice in a MEMS fab, the wafer surfaces are cleaned and planarized, for example, using a chemical mechanical polishing (CMP) technique known in the art. As a result the final thickness of the silicon wafer can be 300 to 700 microns (0.3-0.7 mm) in some applications.

Figure 2:
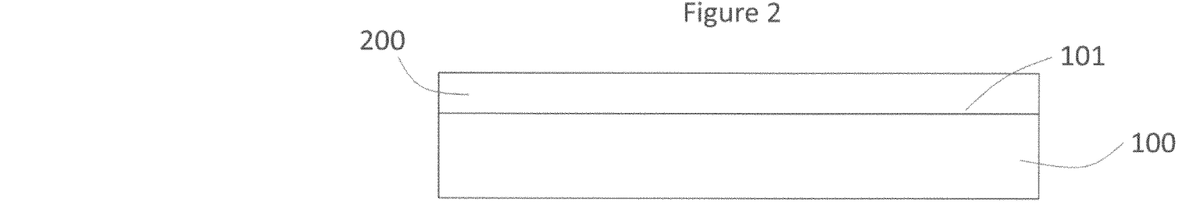
FIG. 2 is a schematic cross sectional view showing a chamber wall material layer deposited on the first surface of the substrate.

FIG. 2 shows the wafer after a chamber wall material layer 200 is deposited on the first surface 101 of the substrate 100. In one example embodiment, the chamber wall material layer is low stress TEOS material. The coating thickness is typically 10 microns. The chamber material can be deposited and the thickness controlled, for example, by PECVD or spin coating depending on the selection of materials.

Figure 3:
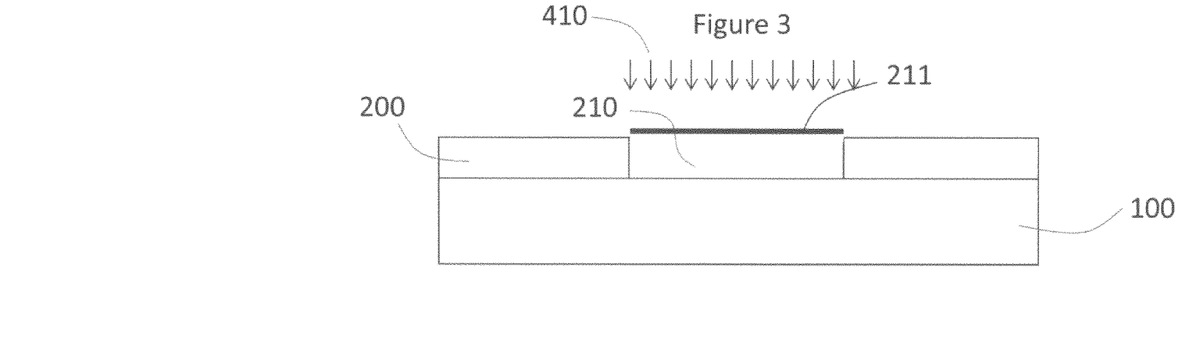
FIG. 3 is a schematic cross sectional view showing a chamber cavity formed in the chamber wall material layer.

FIG. 3 shows a chamber cavity 210 after its formation. As shown in FIG. 3, chamber cavity 210 is created using the following process. A photoresist masking material layer is spin coated over the chamber wall material layer. An optical mask 211 is placed near the wafer with a pattern of dark regions corresponding to the location of the chamber. An actinic light exposure 400 causes the mask material layer to cross-link or harden in the unexposed areas and remain soft in the exposed mask areas. The exposed region of the mask material layer is removed in a solvent developer and the wafer with the mask layer is subjected to an etching process where, for example, an anisotropic plasma dry etch process removes the TEOS in the region that was masked resulting in the chamber 210 being formed.

Figure 4:
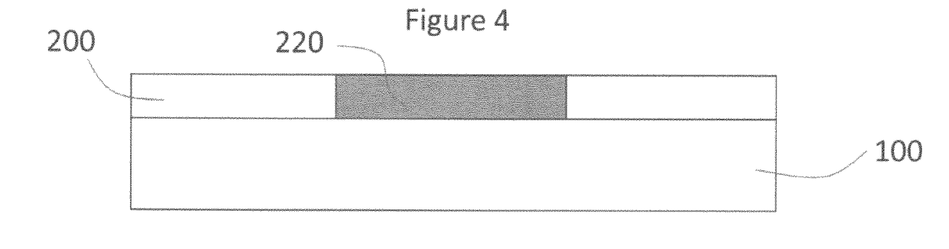
FIG. 4 is a schematic cross sectional view showing the chamber cavity filled with a sacrificial material.

Referring to FIG. 4, in the next step of the process, the chamber cavity 210 is filled with a sacrificial material 220. In one example embodiment, the sacrificial material is a polymeric material, for example, polyimide. The chamber wall material layer 200 and the sacrificial material 220, for example, TEOS and polyimide layers, are planarized. Typically, planarization of these layers is accomplished using a light chemical mechanical polish. The details of this process are described in more detail below with reference to FIGS. 14A, 14B and 14C.

Figure 5:
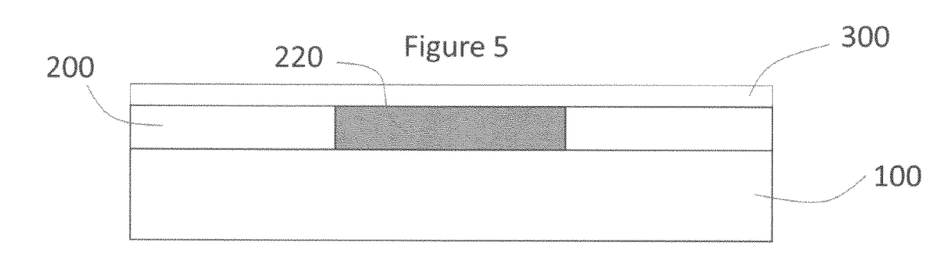
FIG. 5 is a schematic cross sectional view showing a mask material deposited on the chamber wall material layer and the sacrificial material.
Figure 6:
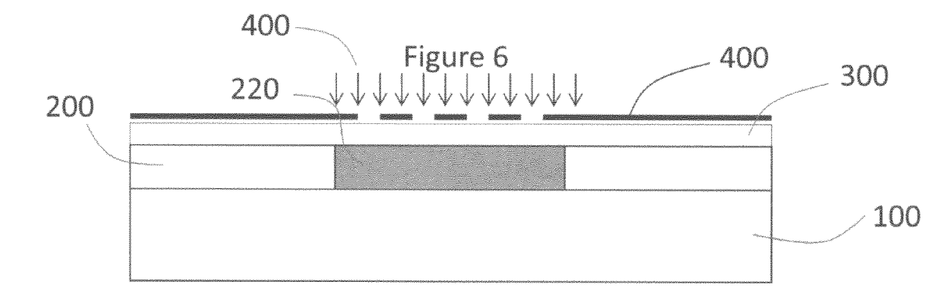
FIG. 6 is a schematic cross sectional view showing a mask used to selectively expose the mask material for a material removal process.

Referring to FIG. 5, a mask layer including, for example, a photoresist material 300, is deposited on the chamber wall material layer 200 and the sacrificial material 220. Selective exposure, shown in FIG. 6, using, for example, a collimated beam of light 410 through an optical mask exposes portions of the mask layer above the chamber region which is currently filled by the sacrificial layer 220. A baking step, for example, is used to cross-link and harden the unexposed portions of the mask layer.

Figure 7:
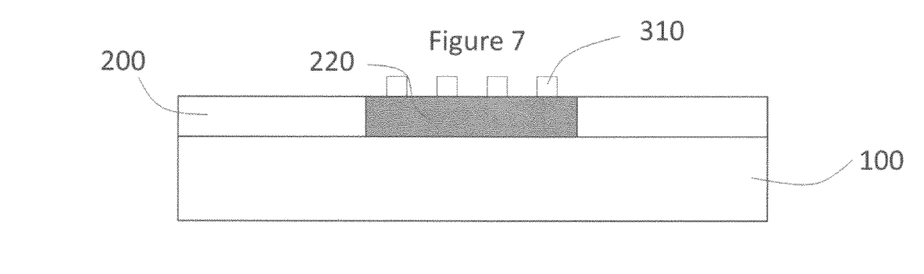
FIG. 7 is a schematic cross sectional view showing a mask pattern including a plurality of discrete portions formed after removal of a selective area(s) of the mask material.

The exposed portion(s) of the mask layer 300 is removed, typically using a wet chemical washing process. As a result of the photolithography step, shown in FIG. 6, selective areas of the mask layer 300 are cross-linked and hardened resulting in the structures 310 shown in FIG. 7 after the removal process. Thus, a mask pattern including a plurality of discrete portions 310 is formed after removal of selective area of the mask layer 300. Due to the nature of the exposure cross-linking and hardening of the photoresist layer 300 and the wet chemical washing process, the discrete portions 310 have vertical side walls which may lead to thin weak spots in the membrane diaphragm (described in more detail below) and, thus, are not desirable for the robust membrane formation in some applications.

The photolithography process described above uses a positive resist in which the portion of the photoresist that is exposed to light becomes soluble to the photoresist developer. The portion of the photoresist that is unexposed remains insoluble to the photoresist developer. It is well known in the art that a negative resist can also be used for mask patterning. A negative resist is a type of photoresist in which the portion of the photoresist that is exposed to light becomes insoluble to the photoresist developer. The unexposed portion of the photoresist is dissolved by the photoresist developer.

Figure 8:
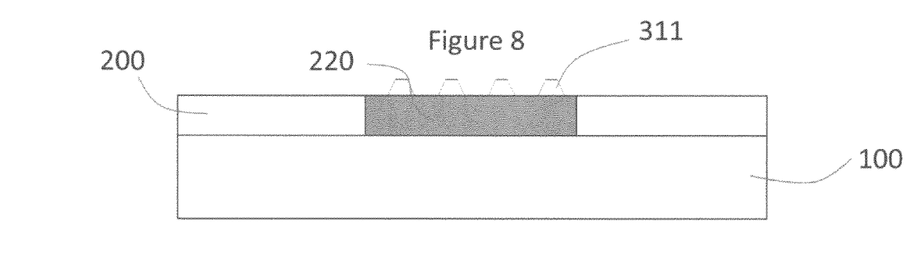
FIG. 8 is a schematic cross sectional view showing a plurality of discrete portions that include sloped side walls.

An alternative mask pattern including a plurality of discrete portions is shown in FIG. 8. The shape of the structures of the discrete portions results in stronger more robust membrane diaphragms (when compared to the shape of the structures shown in FIG. 7). The alternate side wall profiles of the discrete portions are formed using a defocused exposure (converging, non-collimated light) in the photolithography exposure step shown in FIG. 6. This can be accomplished by under-focusing the light source relative to the lens structure in the photo-lithography step. The degree of defocusing will determine the angle of the side walls of the structures 311 shown in FIG. 8, allowing for fine tuning the diaphragm corrugation shape.

Figure 9:
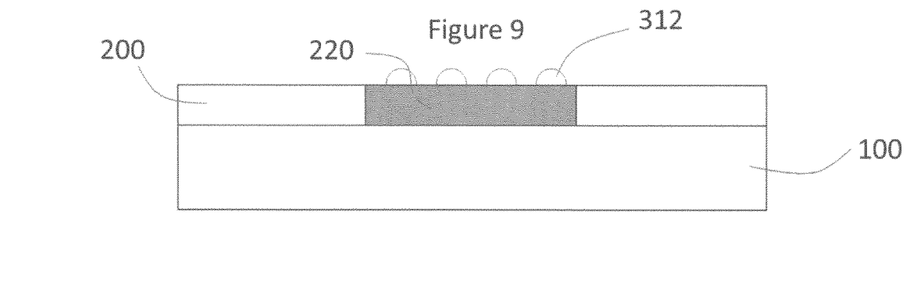
FIG. 9 is a schematic cross sectional view showing a plurality of discrete portions that include smooth curved shapes.

An alternative mask pattern including a plurality of discrete portions is shown in FIG. 9. The shape of the structures of the discrete portions results in stronger more robust membrane diaphragms (when compared to the shape of the structures shown in FIG. 7). An alternative way to alter the profile of the discrete portions is a process step referred to as reflowing. Reflowing is achieved by exposing the wafer with the discrete portions to a high heat for sufficient time above the glass transition temperature (Tg) of the mask material layer to cause the mask material that forms the discrete portions 310 to soften and flow to alter the profile shape to 312 as shown in FIG. 9. In one example embodiment, the smooth curved shape of the plurality of discrete portions 312 is formed by reflowing the mask material after the mask material has been patterned to form a mask pattern including a plurality of discrete portions.

Figure 10:
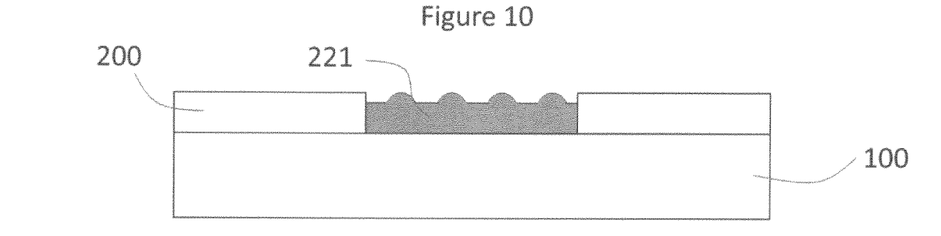
FIG. 10 is a schematic cross sectional view showing an etching process used to transfer the mask pattern including the plurality of discrete portions to the sacrificial material.

Continuing with the fabrication process, and referring to FIG. 10, a material removal process, for example, an etching process, is used to transfer the mask pattern including the plurality of discrete portions to the sacrificial material 221 by removing discrete portions 312 of the mask material and some of the sacrificial material. In one example embodiment, the etching process is an anisotropic plasma dry etch process which maintains the profile of the mask pattern as the mask pattern is transferred to the sacrificial material. In another example embodiment, the etching process is an isotropic etching process that modifies a profile of the mask pattern as the mask pattern is transferred to the sacrificial material.

The profile of the corrugation pattern can be altered by modifying the characteristics, for example, the shape, height, width, depth, or profile, of the discrete portions of the mask material prior to transferring the mask pattern to the sacrificial material. In this manner, the performance characteristics of the corrugated diaphragm can be fine tuned.

The aspect ratio of each of the plurality of discrete portions of the transferred mask pattern in the sacrificial material 221 depends on the selective ratio of the etching process. In one example embodiment, the selective ratio of the anisotropic plasma dry etch process is 1:1 such that the etching process removes the mask material and the sacrificial material at the same rate. This results in the same aspect ratio of the discrete portions of the transferred mask pattern being formed in the sacrificial material 221 as the aspect ratio of each of the plurality of discrete portions in the mask material before the etching process.

Figure 11:
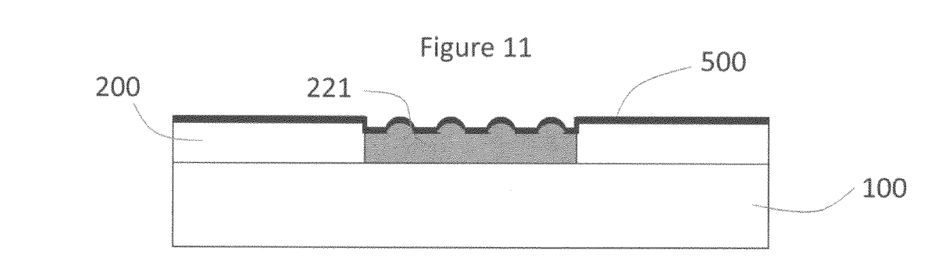
FIG. 11 is a schematic cross sectional view showing a membrane material layer deposited on the chamber wall material layer and the sacrificial material that includes the transferred mask pattern of plurality of discrete portions.

Referring to FIG. 11, in the next step of the process, a membrane material layer 500 is deposited on the chamber wall material layer 200 and the sacrificial material 221 that includes the transferred mask pattern of plurality of discrete portions. This completes the formation of the corrugated membrane. The remaining steps provide fluidic connection and release the membrane.

Figure 12:
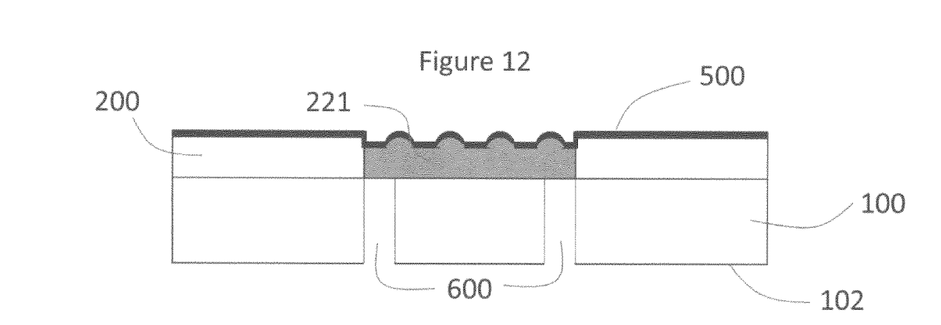
FIG. 12 is a schematic cross sectional view showing some of the substrate removed by a material removal process initiated from the second surface of the substrate to expose the sacrificial material from the second surface of the substrate.

Referring to FIG. 12, some of the substrate is removed using a material removal process initiated from the second surface 102 of the substrate to expose the sacrificial material from the second surface of the substrate. Removal of some of the substrate 100 creates fluid channels 600 through the substrate 100. In one example embodiment, the material removal process is an anisotropic silicon deep reactive ion etch or DRIE process.

Figure 13:
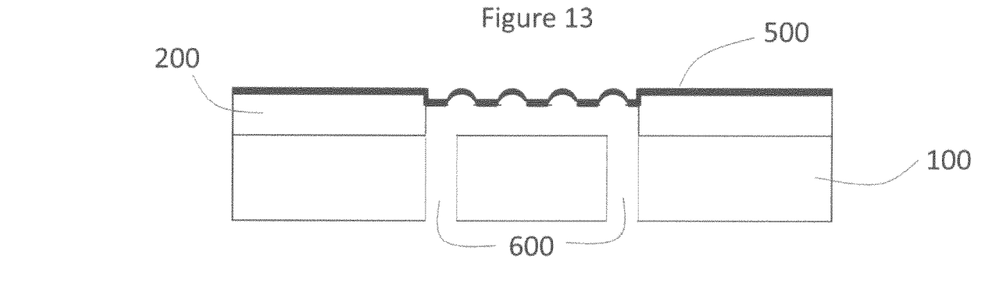
FIG. 13 is a schematic cross sectional view showing removal of the sacrificial material 220 by a material removal process initiated from the second surface of the substrate to release the membrane material layer.

The release of the membrane is accomplished, as shown in FIG. 13, using a material removal process, for example, an etching process initiated from the second surface 102 of the substrate to remove the sacrificial material 220 and release the membrane material layer 500. In one example embodiment, the etching process is an isotropic Oxygen plasma ashing process.

Figure 14A:
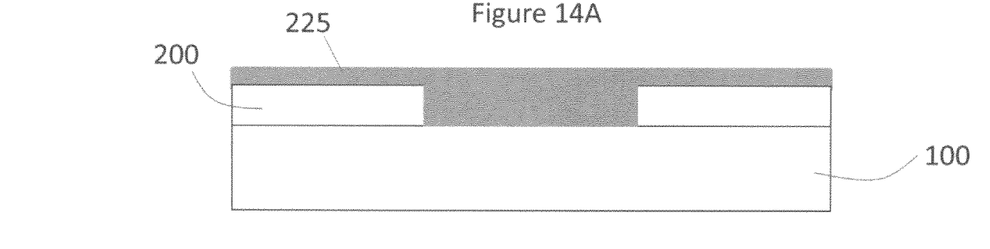
FIG. 14A-14C are schematic cross sectional views showing an example embodiment of one process used to fill the chamber cavity with a sacrificial material.
Figure 14B:
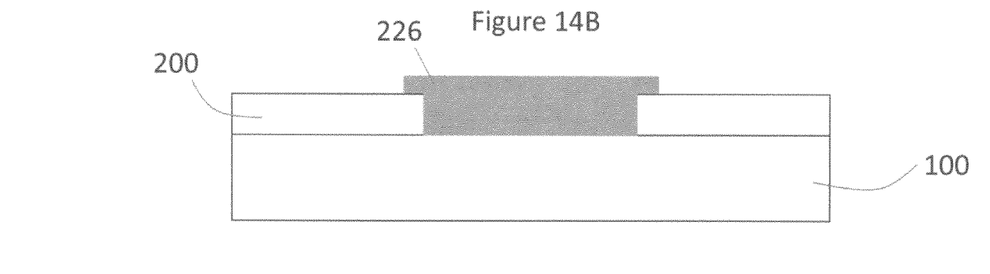
Figure 14C:
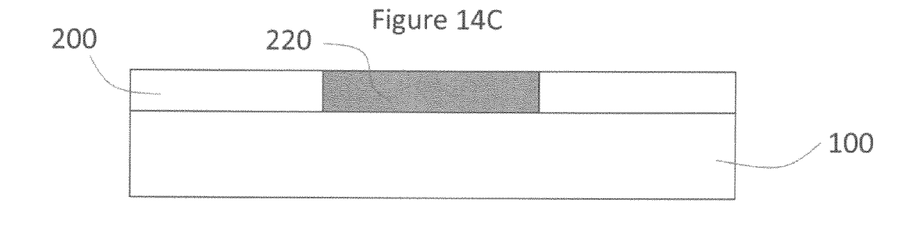

FIGS. 14A-14C describe an example process for filling the chamber cavity 210 with a sacrificial material 220, shown in FIG. 4 as a single step. In FIG. 14A, a sacrificial material 220 is deposited on the chamber wall material layer 200 and in the chamber cavity 210. In one example embodiment, the sacrificial material 225 is a photo-imageable polymer. In FIG. 14B, the sacrificial material from an area outside of the chamber cavity is removed by placing an optical mask near the wafer with a pattern of dark regions corresponding to and slightly larger than the chamber regions and exposing the sacrificial material to crosslink the material only in the chamber region. This results in the sacrificial layer 226 shown in FIG. 14B after developing in a solvent. In FIG. 14C, a planarization process is used to planarize the remaining sacrificial material. In one example embodiment, the planarization process is a CMP process.

Figure 15:
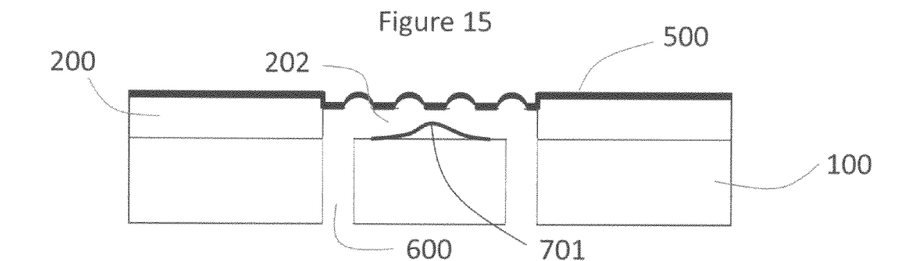
FIG. 15 is a schematic cross sectional view showing a substrate that includes a MEMS actuator.
Figure 16:
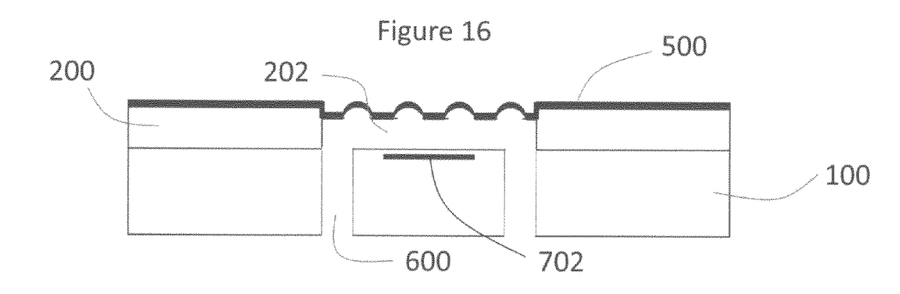
FIG. 16 is a schematic cross sectional view showing a substrate that includes a heater.

Referring to FIG. 15, in some example embodiments of the invention, substrate 100 is provided with or includes a MEMS actuator 701, for example, a piezoelectric actuator or a thermal bi-morph actuator. Referring to FIG. 16, in other example embodiments of the invention, substrate 100 is provided with or includes a heater 702, for example, a thin film resistive heating element.

Typically, the corrugated membrane fabricated using the present invention, is one of a plurality of corrugated membranes fabricated or formed on a common substrate using the process described above. When this occurs, the plurality of corrugated membranes can be referred to as being integrally formed through a series of material layering and processing steps using the fabrication techniques described above to create a monolithic corrugated membrane structure. When compared to other types of structures, monolithic structure configurations help to improve relative alignment of the components included therein or help to reduce spacing in between adjacent components which helps to reduce cost and improve resolution and device life.

In addition to inkjet printing applications in which the fluid typically includes a colorant for printing an image, a fluid ejector incorporating a corrugated membrane MEMS actuator as described above can also be advantageously used in ejecting other types of fluidic materials. Such materials include functional materials for fabricating devices (including conductors, resistors, insulators, magnetic materials, and the like), structural materials for forming three-dimensional structures, biological materials, and various chemicals. This type of fluid ejector can provide sufficient force to eject fluids having a higher viscosity than typical inkjet inks, and does not impart excessive heat into the fluids that could damage them or change their properties undesirably.

The invention has been described in detail with particular reference to certain preferred embodiments thereof, but it will be understood that variations and modifications can be effected within the scope of the invention.

PARTS LIST

100—a substrate
101—a first surface
102—a second surface
200—a chamber wall material layer
210—a chamber cavity
211—an optical mask
220—sacrificial material that fills the chamber cavity
221—a plurality of discrete portions to the sacrificial material
225—a sacrificial material over the entire wafer
226—excess sacrificial material over the chamber cavity
300—a mask material
310—a plurality of discrete portions
311—a plurality of discrete portions that have sloped side walls
312—a plurality of discrete portions that have a smooth curved shape
400—a mask used to selectively expose the mask material 300
410—a collimated beam of light
500—a membrane material layer
600—fluid channels
701—a MEMS actuator
702—a heater

The invention claimed is:

1. A method of fabricating a MEMS device comprising:
providing a substrate including a first surface and a second surface;
providing a chamber wall material layer on the first surface of the substrate, the chamber wall material layer including a chamber cavity, the chamber cavity having a sacrificial material located therein;
depositing a mask material on the chamber wall material layer and the sacrificial material;
patterning the mask material to form a mask pattern including a plurality of discrete portions;
removing the mask material and some of the sacrificial material using an etching process to transfer the mask pattern including the plurality of discrete portions to the sacrificial material;
depositing a membrane material layer on the chamber wall material layer and the sacrificial material that includes the transferred mask pattern including the plurality of discrete portions;
removing some of the substrate using a material removal process initiated from the second surface of the substrate to expose the sacrificial material from the second surface of the substrate; and
removing the sacrificial material using an etching process initiated from the second surface of the substrate to release the membrane material layer.

2. The method of claim 1, wherein providing the chamber wall material layer on the first surface of the substrate, the chamber wall material layer including a chamber cavity, the chamber cavity having a sacrificial material located therein comprises:
depositing a chamber wall material layer on the first surface of the substrate;
removing some of the chamber wall material layer using a material removal process to form a chamber cavity in the chamber wall material layer;
depositing a sacrificial material on the chamber wall material layer and the chamber cavity;
masking the chamber cavity including the sacrificial material;
removing the sacrificial material from an area outside of the chamber cavity; and
planarizing the remaining sacrificial material using a planarization process.

3. The method of claim 1, wherein the substrate includes a MEMS actuator.

4. The method of claim 3, wherein the MEMS actuator includes a heater.

5. The method of claim 1, further comprising:
   reflowing the mask material after the mask material has been patterned to form a mask pattern including a plurality of discrete portions.

6. The method of claim 1, wherein patterning the mask material to form a mask pattern including a plurality of discrete portions includes using a defocused exposure in the patterning process to form the plurality of discrete portions.

7. The method of claim 1, wherein removing the mask material and some of the sacrificial material using an etching process to transfer the mask pattern including the plurality of discrete portions to the sacrificial material includes using an isotropic etching process that modifies a profile of the mask pattern as the mask pattern is transferred to the sacrificial material.

8. The method of claim 1, wherein removing the mask material and some of the sacrificial material using an etching process to transfer the mask pattern including the plurality of discrete portions to the sacrificial material includes using an etching process that modifies a etching rate ration of the mask material and the sacrificial material as the mask pattern is transferred to the sacrificial material.

\* \* \* \* \*